United States Patent
Mi et al.

(10) Patent No.: US 10,490,295 B2
(45) Date of Patent: Nov. 26, 2019

(54) SHIFT REGISTER CIRCUIT AND DRIVING METHOD, GATE DRIVER CIRCUIT, AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Mi, Beijing (CN); Shijun Wang, Beijing (CN); Yanna Xue, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/741,742

(22) PCT Filed: Jun. 16, 2017

(86) PCT No.: PCT/CN2017/088684
§ 371 (c)(1),
(2) Date: Jan. 3, 2018

(87) PCT Pub. No.: WO2018/099047
PCT Pub. Date: Jun. 7, 2018

(65) Prior Publication Data
US 2018/0336957 A1    Nov. 22, 2018

(30) Foreign Application Priority Data

Dec. 2, 2016    (CN) .......................... 2016 1 1109695

(51) Int. Cl.
G11C 19/00    (2006.01)
G11C 19/28    (2006.01)
(Continued)

(52) U.S. Cl.
CPC ............. *G11C 19/287* (2013.01); *G09G 3/20* (2013.01); *G11C 19/28* (2013.01); *G09G 3/3225* (2013.01);
(Continued)

(58) Field of Classification Search
None
See application file for complete search history.

(56) References Cited

U.S. PATENT DOCUMENTS

| 7,719,510 B2 | 5/2010 | Guo et al. |
| 2007/0030239 A1 | 2/2007 | Guo et al. |

(Continued)

FOREIGN PATENT DOCUMENTS

| CN | 202502720 U | 10/2012 |
| CN | 102903321 A | 1/2013 |

(Continued)

OTHER PUBLICATIONS

International Search Report & Written Opinion dated Sep. 20, 2017, regarding PCT/CN2017/088684.

(Continued)

*Primary Examiner* — Tuan T Lam
(74) *Attorney, Agent, or Firm* — Intellectual Valley Law, P.C.

(57) ABSTRACT

The present application discloses a shift register circuit having a plurality of shift register units cascaded in series. The shift register circuit includes a first shift register unit and a second shift register unit. The first shift register unit includes a first pull-up node and a first output terminal and the second shift register unit includes a second pull-up node and a second output terminal. The shift register circuit includes a stabilizer circuit coupled to both the first shift register unit and the second shift register unit such that the first pull-up node is directly connected to the second pull-up (Continued)

node as a common pull-up node and configured to maintain a potential level of the common pull-up node stable during a stabilizing period when none of the first output terminal and the second output terminal output a turn-on signal.

20 Claims, 6 Drawing Sheets

(51) Int. Cl.
*G09G 3/20* (2006.01)
*G09G 3/36* (2006.01)
*G09G 3/3225* (2016.01)

(52) U.S. Cl.
CPC ......... *G09G 3/3648* (2013.01); *G09G 3/3677* (2013.01); *G09G 2300/0809* (2013.01); *G09G 2310/0286* (2013.01); *G09G 2310/08* (2013.01)

(56) References Cited

U.S. PATENT DOCUMENTS

| | | | | |
|---|---|---|---|---|
| 2008/0101529 | A1* | 5/2008 | Tobita | G09G 3/3677 377/64 |
| 2009/0256794 | A1* | 10/2009 | Jang | G11C 19/28 345/100 |
| 2010/0150302 | A1* | 6/2010 | Tsai | G11C 19/28 377/79 |
| 2014/0010341 | A1* | 1/2014 | Wu | G11C 19/00 377/78 |
| 2014/0168044 | A1* | 6/2014 | Hu | G09G 3/3696 345/90 |
| 2015/0280704 | A1* | 10/2015 | Wu | G09G 3/3677 345/100 |
| 2016/0133211 | A1 | 5/2016 | Ma | |
| 2016/0307641 | A1 | 10/2016 | Zheng et al. | |
| 2017/0236480 | A1* | 8/2017 | Dai | G09G 3/3677 345/213 |
| 2017/0261828 | A1* | 9/2017 | Noma | G02F 1/1368 |
| 2017/0330526 | A1* | 11/2017 | Fan | G09G 3/3677 |

FOREIGN PATENT DOCUMENTS

| | | | | |
|---|---|---|---|---|
| CN | 102956269 | A | | 3/2013 |
| CN | 104282288 | A | | 1/2015 |
| CN | 104299583 | A | | 1/2015 |
| CN | 104299853 | * | | 1/2015 |
| CN | 104715734 | A | | 6/2015 |
| CN | 106548740 | A | | 3/2017 |
| KR | 20130062127 | | * 12/2013 | ............... G09G 3/36 |
| TW | 201621850 | A | | 6/2016 |

OTHER PUBLICATIONS

First Office Action in the Chinese Patent Application No. 201611109695.2, dated Dec. 17, 2018; English translation attached.
Second Office Action in the Chinese Patent Application No. 201611109695.2, dated Jun. 14, 2019; English translation attached.

\* cited by examiner

SHIFT REGISTER CIRCUIT AND DRIVING METHOD, GATE DRIVER CIRCUIT, AND DISPLAY APPARATUS

CROSS-REFERENCE TO RELATED APPLICATION

This application is a national stage application under 35 U.S.C. § 371 of International Application No. PCT/CN2017/088684, filed Jun. 16, 2017, which claims priority to Chinese Patent Application No. 201611109695.2, filed Dec. 2, 2016, the contents of which are incorporated by reference in the entirety.

TECHNICAL FIELD

The present invention relates to display technique, particularly to a shift register circuit, a driving method, a gate driver circuit, and a display apparatus.

BACKGROUND

Cascaded gate driver on array (GOA) circuit is a technique of using a gate driver circuit (Gate IC) to replace external driving chip for controlling display apparatus for image display. It has many advantages such as, but not limiting to, reduction of manufacture process, lowering of product costs, and improvement in integration. In addition, the GOA technique allows symmetric design for the display panel and eliminates bonding region of gate IC and layout space for fan-out lead lines so that the display panel can be designed with a narrow border, improving productivity and yield.

GOA circuit has been widely used in display panel including various sized GOA circuit models for different sized display products. Middle or large sized GOA circuits are more stable than small sized GOA circuit and sometime are pushed to be used in small sized mobile product, aiming for achieving higher stability of the display. General speaking, the stability of a GOA unit usually is achieved at an expense of simplicity of the GOA circuit design. A more stable GOA unit means more transistors are implemented therein to make the circuit more complex.

SUMMARY

In one aspect, the present disclosure provides a shift register circuit includes a plurality of shift register units cascaded in series including a first shift register unit and a second shift register unit, the first shift register unit comprising a first pull-up node and a first output terminal and the second shift register unit comprising a second pull-up node and a second output terminal. The shift register circuit further includes a stabilizer circuit coupled to both the first shift register unit and the second shift register unit, wherein the first node is directly connected to the second pull-up node as a common pull-up node and the stabilizer circuit is configured to maintain a potential level of the common pull-up node stable during a stabilizing period when none of the first output terminal and the second output terminal output a turn-on signal.

Optionally, the first shift register unit includes a first pull-down node and the second shift register unit comprises a second pull-down node. The first pull-down node is a shared pull-down node for both the first shift register unit and the second shift register unit in the stabilizing period within a frame of image time with an odd serial number and the second pull-down node is the shared pull-down node for both the first shift register unit and the second shift register unit in the stabilizing period within a frame of image time with an even serial number.

Optionally, the stabilizer circuit includes a signal-control sub-circuit configured to receive a common control signal and set a potential level of the shared pull-down node to that of the common control signal; a first stabilizing sub-circuit configured to receive a fixed low voltage and pull down the potential level of the common pull-up node to the fixed low voltage when the potential level of the shared pull-down node is high; a second stabilizing sub-circuit configured to receive the fixed low voltage and pull down the potential level of the second output terminal to the fixed low voltage when the potential level of the shared pull-down node is high; and a third stabilizing sub-circuit configured to receive the fixed low voltage and pull down the potential level of the first output terminal in the fixed low voltage when the potential level of the shared pull-down node is high.

Optionally, the first shift register unit includes a precharge sub-circuit and a first output sub-circuit respectively coupled to the common pull-up node, wherein the precharge sub-circuit is configured to receive a first input signal and a high-voltage VDD signal, to pull up the potential level of the common pull-up node to high by setting the first input signal as a high-voltage signal, and to pull down the potential level of the shared pull-down node to that of the low-voltage signal when the potential level of the common pull-up node becomes high. The first output sub-circuit includes a capacitor and a transistor configured to receive a first clock signal and controlled by the potential level of the common pull-up node and the first clock signal to output a high-voltage signal to the first output terminal.

Optionally, the second shift register unit includes a reset sub-circuit and a second output sub-circuit respectively coupled to the common pull-up node, wherein reset sub-circuit includes a transistor configured to receive a reset signal and a low-voltage VSS signal and controlled by a high-voltage signal set for the reset signal to pull down the potential level of the common pull-up node to low. The second output sub-circuit includes a capacitor and a transistor configured to receive a second clock signal and controlled by the potential level of the common pull-up node and the second clock signal to output a high-voltage signal to the second output terminal.

Optionally, the precharge sub-circuit includes a first transistor having a gate receiving the first input signal, a first terminal receiving the high-voltage VDD signal, and a second terminal coupled to the common pull-up node; a second transistor having a gate coupled to the common pull-up node, a first terminal coupled to the shared pull-down node, and a second terminal receiving the low-voltage signal, and a third transistor having a gate coupled to the common pull-up node, a first terminal coupled to the signal-control sub-circuit of the stabilizer circuit, and a second terminal receiving the low-voltage signal.

Optionally, the signal-control sub-circuit includes a fourth transistor having a gate receiving the common control signal, a first terminal coupled to the gate, and a second terminal coupled to the first terminal of the third transistor. The signal-control sub-circuit further includes a fifth transistor having a gate coupled to the second terminal of the fourth transistor, a first terminal coupled to the first terminal of fourth transistor, and a second terminal coupled to the shared pull-down node.

Optionally, the first stabilizing sub-circuit includes a sixth transistor having a gate coupled to the shared pull-down node, a first terminal coupled to the common pull-up node, and a second terminal receiving the low-voltage signal. The second stabilizing sub-circuit includes a seventh transistor having a gate coupled to the shared pull-down node, a first terminal coupled receiving the low-voltage signal, and a second terminal coupled to the second output terminal. The third stabilizing sub-circuit includes an eighth transistor having a gate coupled to the shared pull-down node, a first terminal receiving the low-voltage signal, and a second terminal coupled to the first output terminal.

Optionally, the first clock signal includes a waveform characterized by a high-voltage signal with 50% duty cycle in a first period of 4t, where t is a line of image time corresponding to displaying one line of image. The second clock signal includes a waveform characterized by a high-voltage pulse signal with 50% duty cycle in a second period of 4t and provided with a time delay oft relative to the first clock signal. The common control signal includes a high voltage during one frame of image time with an odd serial number to make the potential level of the shared pull-down node of the first shift register unit at high shared with the second shift register unit to maintain potential levels of the common pull-up node, the first output terminal, and the second output terminal at low in the stabilizing period within the one frame of image time with the odd serial number. The common control signal includes a high voltage during one frame of image time with an even serial number to make the potential level of the shared pull-down node of the second shift register unit at high shared with the first shift register unit to maintain potential levels of the common pull-up node, the first output terminal, and the second output terminal at low in the stabilizing period within the one frame of image time with the even serial number.

Optionally, the stabilizer circuit comprises a first stabilizer unit and a second stabilizer unit. The first stabilizer unit is coupled to the first shift register unit and the second stabilizer unit is coupled to the second shift register unit. Each of the first stabilizer unit and the second stabilizer unit is shared in use alternately in time by both the first shift register unit and the second shift register unit to maintain a potential level of the common pull-up node stable while no turn-on signal is outputted at either the first output terminal or the second output terminal.

Optionally, the first stabilizer unit is in use in one frame of image time with the odd serial number and the second stabilizer unit is in use in one frame of image time with the even serial number.

Optionally, the first shift register unit includes a first pull-down node coupled to the first stabilizer unit and the second shift register unit comprises a second pull-down node coupled to the second stabilizer unit. The first pull-down node is used by the first stabilizer unit for controlling both the first shift register unit and the second shift register unit in a stabilizing period of the one frame of image time with the odd serial number. The second pull-down node is used by the second stabilizer unit for controlling both the first shift register unit and the second shift register unit in a stabilizing period of the one frame of image time with the even serial number.

Optionally, the first stabilizer unit includes a first signal-control sub-circuit configured to receive a first common control signal and set a potential level of the first pull-down node to that of the first common control signal. The second stabilizer unit includes a second signal-control sub-circuit configured to receive a second common control signal and set a potential level of the second pull-down node to that of the second common control signal. The first common control signal is provided with a high voltage while the second common control signal is provided with a low voltage in one frame of image time with the odd serial number. The first common control signal is provided with a low voltage while the second common control signal is provided with a high voltage in one frame of image time with the even serial number.

Optionally, the first stabilizer circuit unit includes a first stabilizing sub-circuit configured to receive a fixed low voltage and to pull down a potential level of the common pull-up node to the fixed low voltage when the potential level of the first pull-down node is high; a second stabilizing sub-circuit configured to receive the fixed low voltage and to pull down a potential level of the second output terminal to the fixed low voltage when the potential level of the first pull-down node is high; and a third stabilizer sub-circuit configured to receive the fixed low voltage and to pull down a potential level of the first output terminal to the fixed low voltage when the potential level of the first pull-down node is high.

Optionally, the second stabilizer unit includes a fourth stabilizing sub-circuit configured to receive a fixed low voltage and to pull down a potential level of the common pull-up node to the fixed low voltage when the potential level of the second pull-down node is high; a fifth stabilizing sub-circuit configured to receive the fixed low voltage and to pull down a potential level of the first output: terminal to the fixed low voltage when the potential level of the second pull-down node is high; and a sixth stabilizer sub-circuit configured to receive the fixed low voltage and to pull down a potential level of the second output terminal to the fixed low voltage when the potential level of the second pull-down node is high.

Optionally, the first signal-control sub-circuit includes a first transistor having a gate and a first terminal commonly supplied with the first common control signal; a second transistor having a gate coupled to a second terminal of the first transistor, a first terminal coupled to the first terminal of the first transistor, and a second terminal coupled to the first pull-down node. The second signal-control sub-circuit includes a third transistor having a gate and a first terminal commonly supplied with the second common control signal; a fourth transistor having a gate coupled to a second terminal of the third transistor, a first terminal coupled to the first terminal of the third transistor, and a second terminal coupled to the second pull-down node.

Optionally, the first stabilizing sub-circuit includes a fifth transistor having a gate coupled to the first pull-down node, a first term final coupled to the common pull-up node, and a second terminal received a fixed low voltage. The second stabilizing sub-circuit includes a sixth transistor having a gate coupled to the first pull-down node, a first terminal coupled to the second output terminal, and a second terminal received the fixed low voltage. The third stabilizing sub-circuit includes a seventh transistor having a gate coupled to the first pull-down node, a first terminal coupled to the first output terminal, and a second terminal received the fixed low voltage. The fourth stabilizing sub-circuit includes an eighth transistor having a gate coupled to the second pull-down node, a first terminal coupled to the common pull-up node, and a second terminal received the fixed low voltage. The fifth stabilizing sub-circuit includes a ninth transistor having a gate coupled to the second pull-down node, a first terminal coupled to the first output terminal, and a second terminal received the fixed low voltage. The sixth stabilizing sub-circuit includes a tenth transistor having a gate coupled to the second pull-down node, a first terminal coupled to the second output terminal, and a second terminal received the fixed low voltage.

Optionally, the first shift register unit includes a clear-screen sub-circuit configured to receive a clear-screen signal for controlling potential levels of the first output terminal and the second output terminal at low during any time span between a frame of image time with an odd serial number and a previous or next frame of image time with an even serial number.

Optionally, the clear-screen sub-circuit includes an eleventh transistor having a gate configured to receive the clear-screen signal, a first terminal coupled to the first output terminal, and a second terminal received a fixed low voltage; and a twelfth transistor having a gate configured to receive the clear-screen signal, a first terminal coupled to the second output terminal, and a second terminal received the fixed low voltage.

Optionally, the first common control signal is provided with a low voltage while the second common control signal is provided with a high voltage in one frame of image time with the odd serial number. The first common control signal is provided with a high voltage while the second common control signal is provided with a low voltage in one frame of image time with the even serial number.

Optionally, the first shift register unit is a n-th unit of the plurality of shift register units and the second shift register unit is a (n+1)-th unit of the plurality of shift register units, wherein the n-th unit receives an input signal which is an output signal of a (n−2)-th unit of the plurality of shift register units and a reset signal which is an output signal of a (n+3)-th unit of the plurality of shift register units, where n is an integer greater than 2.

Optionally, the n-th unit is configured to receive a first clock signal and the (n+1)-th unit is configured to receive a second clock signal, wherein the first clock signal and the second clock signal have a same clock period, the second clock signal has a time delay relative to the first clock signal, the time delay being set to be a quarter of the clock period.

In another aspect, the present disclosure provides a gate driver on array circuit including a shift register circuit disclosed herein for providing gate driving signals.

In another aspect, the present disclosure provides a display apparatus including a shift register circuit disclosed herein for providing gate driving signals to drive a matrix of light emitting devices for display frames of image.

In another aspect, the present disclosure provides a method for driving a shift register circuit disclosed herein. The method includes providing a high voltage to the first common control signal and a low voltage to the second common control signal in a frame of image time with an odd serial number; providing the first clock signal with a clock period; providing the second clock signal with the same clock period and a time-delay of ¼ of the clock period relative to the first clock signal; receiving the input signal with a pulse width of ½ of the clock period and a phase ahead of that of the first clock signal by ½ of the clock period; outputting the turn-on signal at the first output terminal with a pulse width of ½ of the clock period and a phase delayed by ½ of the clock period relative to the input signal; outputting the turn-on signal at the second output terminal with a pulse width of ½ of the clock period and a phase delayed by ¼ of the clock signal relative to the turn-on signal at the first output terminal; receiving the reset signal with a pulse width of ½ of the clock period and a phase delayed by ½ of the clock period relative to the turn-on signal at the second output terminal; pulling up the first pull-down node to the high voltage of the first common control signal in a stabilizing period started as the reset signal is provided and lasted to an end of the frame of image time; and maintaining the common pull-up node, the first output terminal, and the second output terminal at a fixed low voltage during the stabilizing period.

Optionally, the method further includes providing a low voltage to the first common control signal and a high voltage to the second common control signal in a frame of image time with an even serial number, pulling up the second pull-down node to the high voltage of the second common control signal in a stabilizing period started as the reset signal is provided and lasted to an end of the frame of image time; and maintaining the common pull-up node, the first output terminal, and the second output terminal at the fixed low voltage during the stabilizing period.

Optionally, the frame of image time with an odd serial number and the frame of image time with an even serial number are alternate in time.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In order to improve GOA circuit stabilities at several nodes especially output terminals, each shift register unit in the shift register circuit usually needs a more complex design with more transistors, driving up the manufacture costs and lowering the production yield. Accordingly, the present invention provides, inter alia, a shift register circuit, a gate driver circuit and a display apparatus having the same, and a driving method thereof that substantially obviate one or more of the problems due to limitations and disadvantages of the related art.

In one aspect, the present disclosure provides a shift register circuit for improving circuit stability of potential levels at output terminals of each shift register unit while without increasing the number of transistors therein. The shift register circuit includes a first shift register unit and a second shift register unit. The shift register circuit includes a stabilizer circuit shared by the first shift register unit and the second shift register unit for stabilizing potential levels of pull-up nodes and output terminals of both the first shift register unit and the second shift register unit when no turn-on signals are outputted from the output terminals. Optionally, the first shift register unit and the second shift register unit are two adjacent shift register units. Optionally, the first shift register unit and the second shift register unit are not in a specific order. Optionally, one stabilizer circuit is implemented for stabilizing two or more shift register units arbitrarily selected from the shift register circuit formed as a plurality of shift register units cascaded in series.

Figure 1:
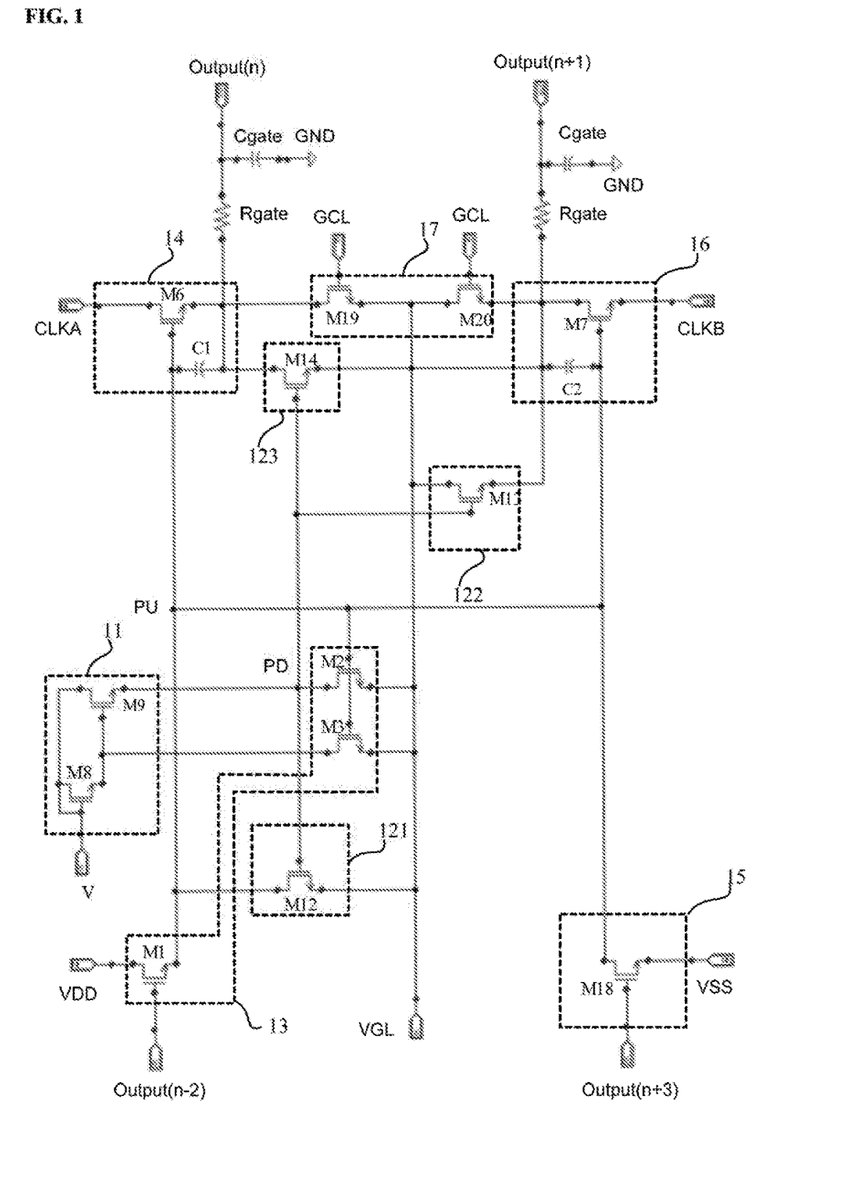
FIG. 1 is a shift register circuit according to a specific embodiment of the present disclosure.

FIG. 1 is a shift register circuit according to a specific embodiment of the present disclosure. Referring to FIG. 1, part of the shift register circuit is shown, including a first output terminal Output(n) associated with the first shift register unit and a second output terminal Output(n+1) associated with the second shift register unit. A pull-up node of the first shift register unit has been directly connected to a pull-up node of the second shift register unit, forming a common pull-up node PU. The first shift register unit and the second shift register unit also share a pull-down node PD.

Optionally, the shift register circuit includes a stabilizer circuit configured as a combination of several sub-circuits including a signal-control sub-circuit 11, a first stabilizing sub-circuit 121, a second stabilizing sub-circuit 122, and a third stabilizing sub-circuit 123. The signal-control sub-circuit 11 is configured to pass a common control signal V to the pull-down node PD shared by the first shift register unit and the second shift register unit. The first stabilizing sub-circuit 121 is configured to receive a potential level at the shared pull-down node PD and a fixed low voltage VGL, and to pull down a potential level of the common pull-up node PU to low when the potential level of the shared pull-down node PD is high. The second stabilizing sub-circuit 122 is configured to receive a potential level of the shared pull-down node PD and the fixed low voltage VGL, and to pull down a potential level of the second output terminal Output(n+1) to low when the potential level of the shared pull-down node PD is high. The third stabilizing sub-circuit 123 is configured to receive the potential level of the shared pull-down node PD and the fixed low voltage VGL, and to pull down a potential level of the first output terminal Output(n) to low when the potential level of the shared pull-down node PD is high.

The first shift register unit also includes a precharge sub-circuit 13 and a first output sub-circuit 14, coupled to each other through the common pull-up node PU. The precharge sub-circuit 13 is configured to receive an input signal from an input terminal Output(n−2) and a VDD signal to set the potential level of the common pull-up node PU, and to pull down the potential level of the pull-down node PD to low when the common pull-up node PU is raised to high. The VDD signal is a high-voltage power-supply signal. The first output sub-circuit 14 is configured to receive the potential level of the common pull-up node PU and a first clock signal CLKA. The first output sub-circuit 14 is controlled by the potential level of the common pull-up node PU and the first clock signal CLKA to output a high-voltage signal to the first output terminal Output(n). The second shift register unit includes a reset sub-circuit 15 and a second output sub-circuit 16, coupled to each other via the common pull-up node PU. The reset sub-circuit 15 is configured to receive a reset signal [denoted as Output(n+3) in FIG. 1] and a VSS signal. The reset sub-circuit is controlled by the reset signal to pull down the potential level of the common pull-up node PU to low. The VSS signal is a low-voltage power-supply signal, usually a ground signal. The second output sub-circuit 16 is configured to receive the potential level of the common pull-up node PU and a second clock signal CLKB. The second output sub-circuit is controlled by the potential level of the common pull-up node PU and the second clock signal CLKB to output a high voltage signal to the second output terminal Output(n+1).

Optionally, the shift register circuit includes a clear-screen sub-circuit 17, as shown in FIG. 1. The clear-screen sub-circuit is configured to receive a fixed low voltage VGL and a clear-screen signal GCL, and controlled by the clear-screen signal GCL to pull down potential levels of the first output terminal and the second output terminal during a time duration between ant two frames of image time.

In an embodiment, the first shift register unit is a n-th unit and the second shift register unit is a (n+1)-th unit, using a same stabilizer circuit for stabilize potential levels of the common pull-up node and two output terminals. The n-th unit includes the precharge sub-circuit 14 and the first output sub-circuit 14. The (n+1)-th unit includes the reset sub-circuit 15 and the second output sub-circuit 16. The n-th unit and the (n+1)-th unit are two shift register units selected from a plurality of shift register units cascaded in series of the shift register circuit. The plurality of shift register units cascaded in series also includes a (n−2)-th unit and a (n+3)-th unit, and others.

In the embodiment, the precharge sub-circuit 13 of the n-th unit includes three transistors M1, M2, and M3. The transistor M1 has a control terminal or a gate supplied with an input signal which is actually an output signal outputted from the output terminal Output(n−2) of the (n−2)-th unit of the shift register circuit. M1 also has a first terminal supplied with the VDD signal and a second terminal coupled to the common pull-up node PU. The transistor M2 has a control terminal or a gate coupled to the common pull-up node PU, a first terminal coupled to the shared pull-down node PD, and a second terminal supplied with the fixed low voltage VGL. The transistor M3 has a control terminal or a gate coupled to the common pull-up node PU, a first terminal coupled to a second terminal of a transistor M8 or a gate of another transistor M9 in the signal-control sub-circuit 11 of the stabilizer circuit, and a second terminal supplied with the fixed low voltage VGL. When the input signal from Output (n−2) is a high voltage, the potential level of the common pull-up node PU is pushed to high to turn M2 and M3 on. The transistor M2 is turned on to allow the fixed low voltage is applied to the shared pull-down node PD. The transistor M3 is turned on to pull down a potential level of the gate of the transistor M9 to turn M9 off so that the shared pull-down node PD will not be affected by whether a common control signal V applied to the signal-control sub-circuit 11 is high or low. So, the low voltage applied to the shared pull-down node PD can keep the potential level of PD stable at low.

The first output sub-circuit 14 of the n-th unit includes a transistor M6 and a capacitor C1. The transistor M6 has a control terminal (gate) coupled to the common pull-up node PU, a first terminal supplied with the first clock signal CLKA, and a second terminal coupled to the first output terminal Output(n). The capacitor C1 has a first terminal coupled to the common pull-up node PU and a second terminal coupled to the second terminal of M6.

The (n+1)-th unit includes the reset sub-circuit 15 and the second output sub-circuit 16. The reset sub-circuit 15 includes a transistor M18 having a control terminal (gate) configured to receive a reset signal which is actually an output signal outputted from the output terminal Output(n+3) of the (n+3)-th unit of the shift register circuit. M18 has a first terminal received the VSS signal (ground) and a second terminal coupled to the common pull-up node PU. The second output sub-circuit 16 includes a transistor M7 and a capacitor C2. The transistor M7 has a control terminal (gate) coupled to the common pull-up node PU, a first terminal received the second clock signal CLKB, and a second terminal coupled to the second terminal of M7.

The signal-control sub-circuit 11 of the stabilizer circuit includes the transistor M8 and the transistor M9. M8 has its control terminal connected to its first terminal commonly supplied with the common control signal V. M8 has the second terminal connected to the precharge sub-circuit 13 (to the first terminal of M3). M9 has its control terminal coupled to the second terminal of M8, a first terminal coupled to the first terminal of M8, and a second terminal coupled to the shared pull-down node PD.

The first stabilizing sub-circuit 121 includes a transistor M12 having a control terminal coupled to the shared pull-down node PD, a first terminal coupled to the common pull-up node PU, and a second terminal received the fixed low voltage VGL. The second stabilizing sub-circuit 122 includes a transistor M13 having a control terminal coupled to the shared pull-down node PD, a first terminal coupled to the second output terminal. Output(n+1), and a second terminal received the fixed low voltage VGL. The third stabilizing sub-circuit 123 includes a transistor M14 having a control terminal coupled to the shared pull-down node PD, a first terminal coupled to the first output terminal Output(n), and a second terminal received the fixed low voltage VGL.

Figure 6:
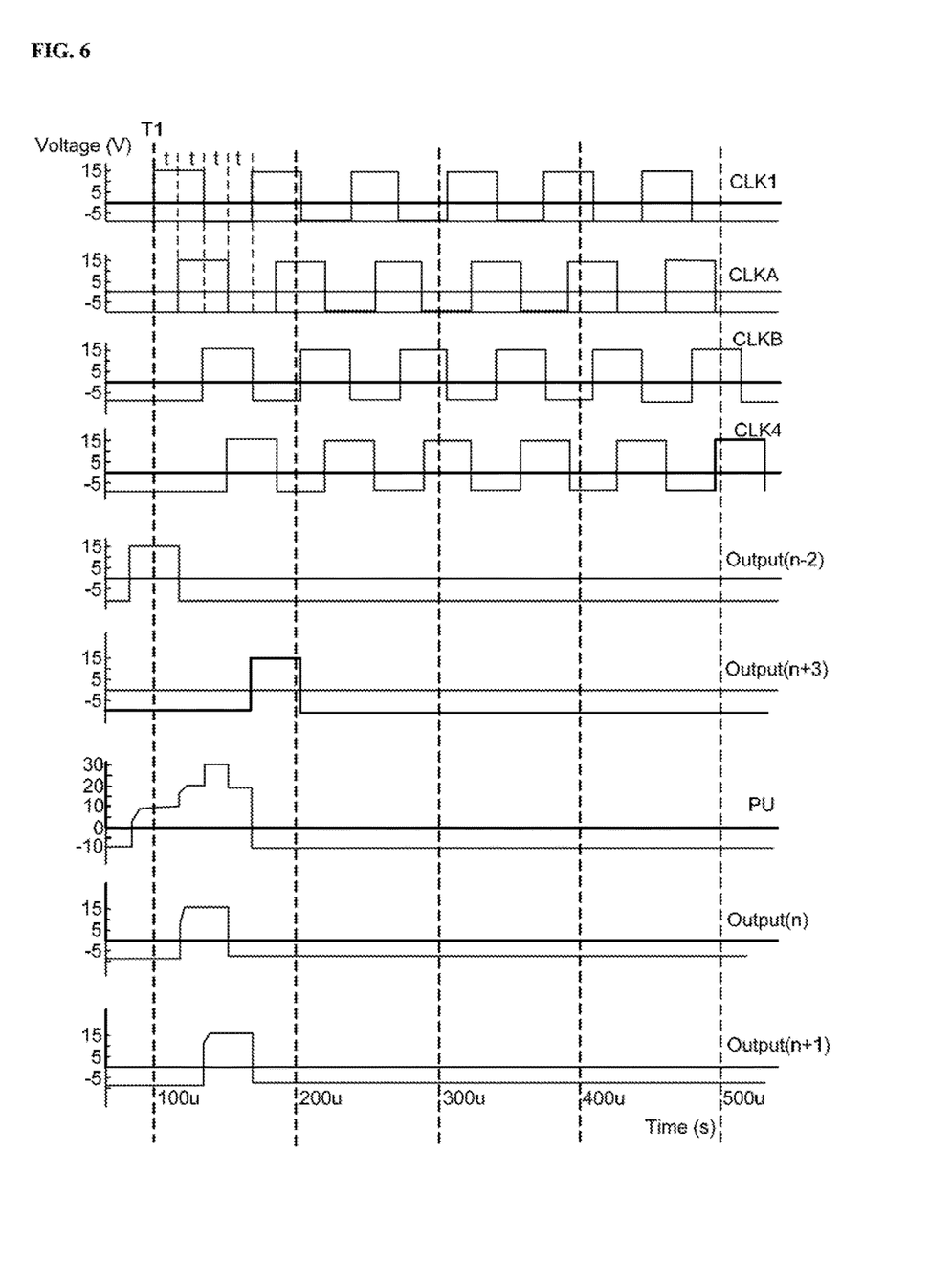
FIG. 6 is a timing waveform diagram of signals for driving the shift register circuit of FIG. 3 according to some embodiments of the present disclosure.

For driving the shift register circuit described herein, the VDD signal is provided as a high voltage, the VSS signal a ground signal, and the common control signal V is provided as a high voltage such as 15V. In addition, the first clock signal CLKA and the second clock signal CLKB described above optionally have a same clock period. The second clock signal CLKB is provided with a phase delay of ¼ of the clock period relative to the first clock CLKA. As a result, the output signal [Output(n)] from the n-th unit of the shift register circuit is configured to have a phase delay of ½ of the clock period relative to the input signal [Output(n−2)]. The output signal [Output(n+1)] from the (n+1)-th unit of the shift register circuit is configured to have a phase delay of ¼ of the clock period relative to the output signal [Output(n)]. The reset signal is configured to have a phase delay of ½ of the clock period relative to the output signal [Output(n+1)] from the (n+1)-th unit of the shift register circuit. Here the clock period is a single period of the clock signal wave including a time duration at a high-voltage state and a time duration at a low-voltage state. FIG. 6 shows a timing waveform of signals for driving the shift register circuit of FIG. 3 according to some embodiments of the present disclosure.

Referring to FIG. 6, a driving operation of the shift register circuit is described briefly below including at least a precharge phase, an output phase, and a pull-down phase. In the precharge phase, the input signal is provided as a high voltage pulse, turning on the precharge sub-circuit 13. The precharge sub-circuit 13 applies the VDD signal to charge the common pull-up node PU.

In the output phase, when the first clock signal CLKA rises to high voltage from a low voltage, the potential level of the common pull-up node PU is pushed to a higher level by the first output sub-circuit 14. The first output sub-circuit 14 then outputs a high-voltage (turn-on) signal to the first output terminal Output(n). At this time the second output terminal Output(n+1) still outputs a low-voltage signal as the transistor M7 is turned off. When the second clock signal CLKB is changed from low voltage to a high-voltage pulse, the second output sub-circuit 16 is configured, via a similar mechanism described above, to output a high-voltage (turn-on) signal to the second output terminal Output(n+1).

When the time duration of the high-voltage pulse of the first clock signal CLKA ends, it changes to low voltage, accordingly, the first output terminal outputs a low-voltage signal. At this time, the second output terminal continues to output a high-voltage signal. When the time duration of the high-voltage pulse of the second clock signal CLKB ends, it changes to low voltage, accordingly, the second output terminal also outputs low-voltage signal.

In the pull-down phase, the reset signal is provided with a high voltage, allowing the reset sub-circuit 15 to apply the VSS signal to the common pull-up node PU to pull down its potential level to low. Then, the transistor M6 in the first output sub-circuit 14 and the transistor M7 in the second output sub-circuit 16 are both turned off. Accordingly, both potential levels of the first output terminal Output(n) and the second output terminal Output(n+1) are pulled down to low and kept stable at low.

During the pull-down phase, the stabilizer circuit shared by both the n-th unit and the (n+1)-th unit is operated to maintain stability of the potential levels at the common pull-up node PU, the first output terminal Output(n), and the second output terminal Output(n+1). Specifically, when the potential level of the common pull-up node PU is pulled down by the reset signal, M2 and M3 are turned off. The potential level of the shared pull-down node PD is raised to high by a high voltage of the common control signal V applied to the signal-control sub-circuit 11. As the potential level of node PD is high, the first stabilizing sub-circuit 121 (with M12 turned on) thus applies the fixed low voltage VGL to the common pull-up node PU. At the same time, the second stabilizing sub-circuit 122 (with M13 turned on) applies the fixed low voltage VGL to the second output terminal Output(n+1) and the third stabilizing sub-circuit 123 (with M14 turned on) applies the fixed low voltage VGL to the first output terminal Output(n). For each frame of image time, the pull-down phase corresponds a stabilizing period lasts a whole time after the reset signal is provided with a high-voltage pulse to the second shift register unit until the end of the frame of image time. The common pull-up node PU, the first output terminal Output(n), and the second output terminal Output(n+1) all are kept stable at a low potential level by a simple stabilizer circuit shared by the two shift register units. The circuit stability of the shift register circuit is enhanced especially during the time when both output terminals output no high-voltage turn-on signals.

Figure 2:
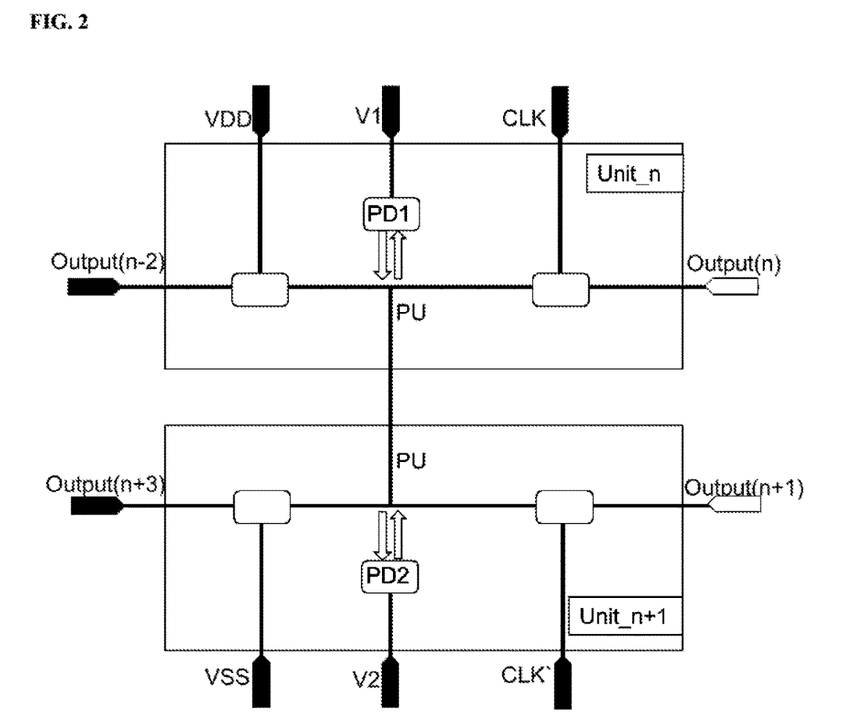
FIG. 2 is a shift register circuit including a n-th unit and a (n+1)-th unit according to some embodiments of the present disclosure.

FIG. 2 is a shift register circuit including n-th unit and a (n+1)-th unit according to some embodiments of the present disclosure. Referring to FIG. 2, the shift register circuit includes a first shift register unit having an output terminal Output(n), a second shift register unit having an output terminal Output(n+1), a first stabilizer unit and a second stabilizer unit alternately in time shared by the first shift register unit and the second shift register unit. The first stabilizer unit is used by both the first shift register unit and the second shift register unit in a first time period and the second stabilizer unit is used by both the first shift register unit and the second shift register unit in a second time period. Optionally, the first stabilizer unit is used by both the first shift register unit and the second shift register unit in a frame of image time, with an odd serial number and alternately the second stabilizer unit is used by both the first shift register unit and the second shift register unit in a frame of image time with an even serial number. Making the stabilizer circuit in the shift register circuit to work alternately in phase with one or more frames of image time can simplify the circuit design and also can solve an issue of threshold voltage drift over time of the transistors in the stabilizer circuit.

Referring to FIG. 2, the pull-up node in the first shift register unit (Unit_n) is directly connected to the pull-up node in the second shift register unit (Unit_n+1), forming a common pull-up node PU. The pull-down node PD1 in the first shift register unit (Unit_n) and the pull-down node PD2 in the second shift register unit (Unit_n+1) are controlled by two control signals V1 and V2 to separately work for both units alternate-in-time.

Figure 3:
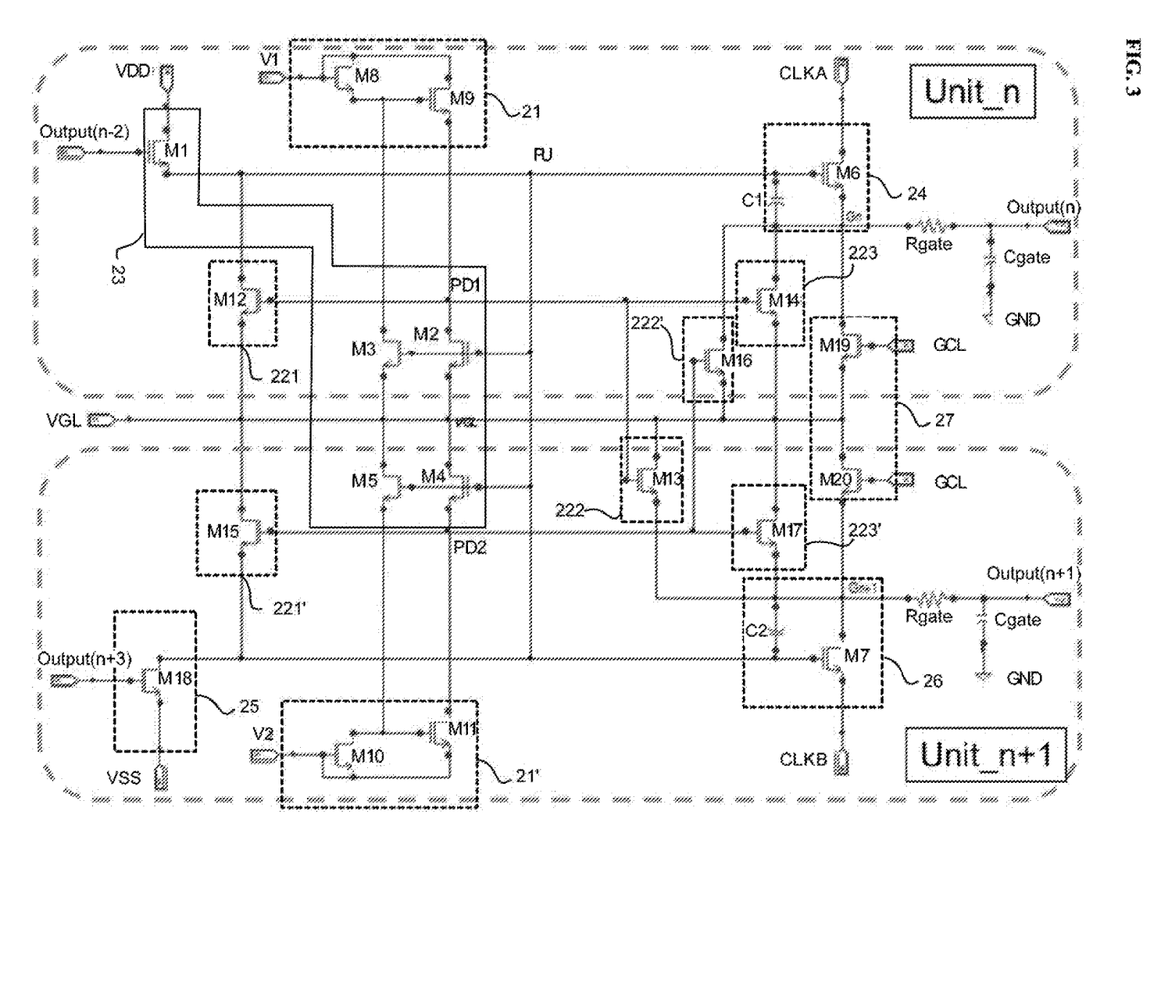
FIG. 3 is a shift register circuit according to another specific embodiment of the present disclosure.

FIG. 3 is a shift register circuit according to another specific embodiment of the present disclosure. Referring to FIG. 3, the shift register circuit includes a first shift register unit Unit_n having an output terminal Output(n), a second shift register unit Unit_n+1 having an output terminal Output(n+1), a first stabilizer unit associated with the Unit_n, and a second stabilizer unit associated with the unit_n+1. The pull-up node of Unit_n and Unit_n+1 is directly connected to one node PU. The first pull-down node PD1 in Unit_n and the second pull-down node PD2 in Unit_n+1 are used alternately in time by both. Unit_n and Unit_n+1.

Referring to FIG. 3, the first shift register unit Unit_n includes a precharge sub-circuit 23 and a first output sub-circuit 24 coupled together via the node PU. The precharge sub-circuit 23 is configured to receive an input signal [e.g., Output(n−2)] and a VDD signal. Under the control of the input signal, the precharge sub-circuit 23 is configured to pull up a potential level of the pull-up node PU to high and further pull down a potential level of the first pull-down node PD1 as well as a potential level of the second pull-down node PD2 to low. The first output sub-circuit 24 is configured to receive the potential level of the pull-up node PU and a first clock signal CLKA. Under the control of the potential level of the pull-up node PU and the first clock signal, the first output sub-circuit is configured to output a high-voltage turn-on signal to the first output terminal Output(n).

The second shift register unit Unit_n+1 includes a reset sub-circuit 25 and a second output sub-circuit 26 coupled together via the pull-up node PU. The reset sub-circuit 25 is configured to receive a reset signal [e.g., Output(n+3)] and a VSS signal. Under a control of the reset signal the reset sub-circuit 25 is configured to pull down the potential level of the pull-up node PU. The second output sub-circuit 26 is configured to receive the potential level of the pull-up node PU and a second clock signal CLKB. Under controls of the potential level of the pull-up node PU and the second clock signal CLKB, the second output sub-circuit is configured to output a high-voltage turn-on signal to the second output terminal Output(n+1).

The first shift register unit and the second shift register unit alternately use the first stabilizer unit and the second stabilizer unit for stabilizing potential levels of circuit nodes and output terminals of both shift register units. Particularly, in a first time period, the first and second shift register units share the first stabilizer unit, and in a second time period alternate in time, the first and second shift register units share the second stabilizer unit.

Referring to FIG. 3, the first stabilizer unit includes a first signal-control sub-circuit 20 configured to pass a first common control signal V1 to the first pull-down node PD1 and the second stabilizer unit includes a second signal-control sub-circuit 20' configured to pass a second common control signal V2 to the second pull-down node PD2. Among V1 and V2, one is set to a high voltage and the other is set to a low voltage in any one of those alternate time periods.

Referring to FIG. 3 again, the first stabilizer unit also includes a first stabilizing sub-circuit 221, a second stabilizing sub-circuit 222, and a third stabilizing sub-circuit 223 associated with the first pull-down node PD1. The first stabilizing sub-circuit 221 is configured to receive the potential level of the first pull-down node PD1 and a fixed low voltage VGL and to pull down the potential level of the pull-up node PU to low when the potential level of PD1 is high. The second stabilizer sub-circuit 222 is configured to receive the potential level of PD1 and the VGL, and to pull down the potential level of the second output terminal Output(n+1) to low when the potential level of PD1 is high. The third stabilizer sub-circuit 223 is configured to receive the potential level of PD1 and the VGL, and to pull down the potential level of the first output terminal Output(n) to low when the potential level of PD1 is high.

The second stabilizer unit also includes a fourth stabilizing sub-circuit 221', a fifth stabilizing sub-circuit 222', and a sixth stabilizing sub-circuit 223' associated with the second pull-down node PD2. The fourth stabilizing sub-circuit 221' is configured to receive the potential level of the second pull-down node PD2 and the fixed low voltage VGL and to pull down the potential level of the pull-up node PU to low when the potential level of PD2 is high. The fifth stabilizer sub-circuit 222' is configured to receive the potential level of PD2 and the VGL, and to pull down the potential level of the first output terminal Output(n) low when the potential level of PD2 is high. The sixth stabilizer sub-circuit 223' is configured to receive the potential level of PD2 and the VGL, and to pull down the potential level of the second output terminal Output(n+1) to low when the potential level of PD2 is high.

Optionally, the shift register circuit of FIG. 3 also includes a clear-screen sub-circuit 27 configured to, under a control of a clear-screen signal, pull down potential levels of both the first output terminal and the second output terminal during a blank period between any two adjacent frames of image time.

Referring to FIG. 3, the first shift register unit is a n-th unit and the second shift register unit is a (n+1)-th unit, although the invention does not limit the two shift register units to two adjacent units in the cascade series of the shift register circuit. Both the n-th unit and the (n+1)-th unit uses one of the first stabilizer unit and the second stabilizer unit in alternate frame of image time.

Referring to FIG. 3, the precharge sub-circuit 23 in the n-th shift register unit includes five transistors M1 through M5. The transistor M1 has a control terminal supplied with an input signal [e.g., Output(n)], a first terminal supplied a VDD signal, and a second terminal coupled to the pull-up node PU. The transistor M2 has a control terminal coupled to the pull-up node PU, a first terminal coupled to the first pull-down node PD1, and a second terminal supplied with a fixed low voltage VGL. The transistor M3 has control terminal coupled to the pull-up node PU, a first terminal coupled to the first signal-control sub-circuit 21 of the first stabilizer unit, and a second terminal supplied with the fixed low voltage VGL. The transistor M4 has a control terminal coupled to the pull-up node PU, a first terminal coupled to the second pull-down node PD2, and a second terminal supplied with the fixed low voltage VGL. The transistor M5 has control terminal coupled to the pull-up node PU, a first terminal coupled to the second signal-control sub-circuit 21' of the second stabilizer unit, and a second terminal supplied with the fixed low voltage VGL.

The first output sub-circuit 24 of the n-th shift register unit includes a transistor M6 and a first capacitor C1. The transistor M6 has a control terminal coupled to the pull-up node PU, a first terminal supplied with a first clock signal CLKA, and a second terminal coupled to the first output terminal Output(n). The first capacitor C1 has a first terminal coupled to the pull-up node PU and a second terminal coupled to the second terminal of M6.

The (n+1)-th shift register unit includes a reset sub-circuit 25 and a second output sub-circuit 26. The reset sub-circuit 25 includes a transistor M18 having a control terminal configured to receive a reset signal [e.g., Output(n+3)], a first terminal received a ground signal VSS, and a second terminal coupled to the pull-up node PU. The second output sub-circuit 26 includes a transistor M7 and a second capacitor C2. The transistor M7 has a control terminal coupled to the pull-up node PU, a first terminal supplied with a second clock signal CLKB, and a second terminal coupled to the second output terminal Output(n+1). The second capacitor C2 has a first terminal coupled to the pull-up node PU and a second terminal coupled to the second terminal of M7.

For the first stabilizer unit, referring to FIG. 3, the first signal-control sub-circuit 21 includes two transistors M8 and M9. The transistor M8 has a control terminal connected to its first terminal commonly supplied with a first common control signal V1. M8 has a second terminal coupled to the precharge sub-circuit 23 (at the first terminal of M3). The transistor M9 has its control terminal connected to the second terminal of M8, a first terminal coupled to the first terminal of M8, and a second terminal coupled to the first pull-down node PD1.

The first stabilizing sub-circuit 221 includes a transistor M12 having a control terminal coupled to the first pull-down node PD1, a first terminal coupled to the pull-up node PU, and a second terminal supplied with the fixed low voltage VGL. The second stabilizing sub-circuit 222 includes a transistor M13 having a control terminal coupled to the first pull-down node PD1, a first terminal coupled to the second output terminal Output(n+1), and a second terminal supplied with the fixed low voltage VGL. The third stabilizing sub-circuit 223 includes a transistor M14 having a control terminal coupled to the first pull-down node PD1, a first terminal coupled to the first output terminal Output(n), and a second terminal supplied with the fixed low voltage VGL.

Similarly for the second stabilizer unit, the second signal-control sub-circuit 21' includes two transistors M10 and M11. The transistor M10 has a control terminal connected to its first terminal commonly supplied with a first common control signal V2. M10 has a second terminal coupled to the precharge sub-circuit 23 (at the first terminal of M5). The transistor M11 has its control terminal connected to the second terminal of M10, a first terminal coupled to the first terminal of M10, and a second terminal coupled to the second pull-down node PD2.

Similarly, the fourth stabilizing sub-circuit 221' includes a transistor M15 having a control terminal coupled to the second pull-down node PD2, a first terminal coupled to the pull-up node PU, and a second terminal supplied with the fixed low voltage VGL. The fifth stabilizing sub-circuit 222' includes a transistor M16 having a control terminal coupled to the second pull-down node PD2, a first terminal coupled to the first output terminal Output(n), and a second terminal supplied with the fixed low voltage VGL. The sixth stabilizing sub-circuit 223' includes a transistor M17 having a control terminal coupled to the second pull-down node PD2, a first terminal coupled to the second output terminal Output(n+1), and a second terminal supplied with the fixed low voltage VGL.

Referring to FIG. 3, the clear-screen sub-circuit 27 includes two transistors M19 and M20 both with control terminal receiving a clear-screen signal GCL. The transistor M19 has first terminal coupled to the first output terminal Output(n) and a second terminal supplied with the fixed low voltage VGL. The transistor M20 has a first terminal coupled to the second output terminal Output(n+1) and a second terminal supplied with the fixed low voltage VGL. M19 and M20, under the control of the clear-screen signal GCL during a blank period between any two adjacent frames of image time, respectively pull down the potential levels of the first output terminal and the second output terminal to a low level of the fixed low voltage VGL. This will eliminate a residual image effect on this frame of image due to display signals in last frame of image.

In some embodiments, the shift register circuit of FIG. 3 needs nine clock signals and three DC voltage signals for driving circuit operation to generate proper output signals used as gate driving signals for a display panel. The three DC voltage signals are the high-voltage VDD signal, low-voltage VSS ground signal, and a fixed low voltage VGL. Among the nine clock signals, two are common control signals. The first common control signal V1 and the second common control signal V2 are alternately supplied as a high-voltage signal in one of a whole frame of image time of an odd serial number and a next whole frame of image time of an even serial number to allow the first pull-down node PD1 and the second pull-down node PD2 to be effective for controlling the first stabilizer unit and the second stabilizer unit alternately in the two frames of image time. Four clock signals are provided with a same clock period (e.g., corresponding to 4 lines of image time). Two of the four clock signals are CLKA and CLKB used respectively by the n-th unit and the WI)-th unit with CLKB delayed by ¼ of a clock period relative to CLKA. Other two of the four clock signals are CLK1 and CLK4 respectively used by adjacent (n−1)-th unit and (n+2)-th unit. Additional clock signals in the nine clock signals include a precharge signal which is an input signal for the n-th unit, e.g., Output(n−2); a pull-down signal which is a reset signal for the (n+1)-th unit, e.g., Output(n+3); and a clear-screen signal GCL. Optionally, the output signal from the first output terminal Output(n) has a phase delay of ½ of a clock period relative to the input signal Output(n−2). Optionally, the output signal from the second output terminal Output(n+1) has a phase delay of ¼ of a clock period relative to the output signal from the first output terminal Output(n).

Figure 4:
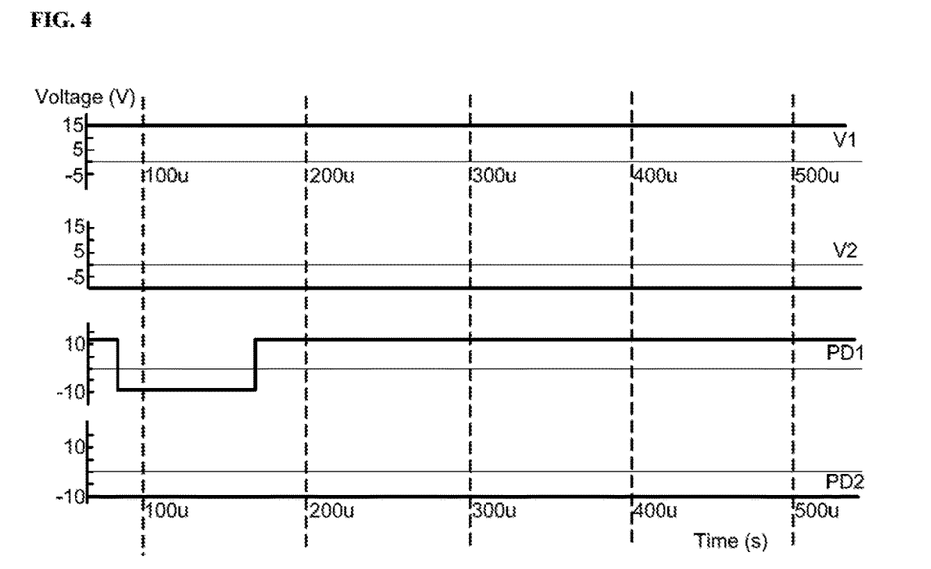
FIG. 4 is a waveform diagram of signals used for stabilizing the shift register circuit of FIG. 3 in a frame of image time with an odd serial number according to some embodiments of the present disclosure.

FIG. 4 is a waveform diagram of signals used for stabilizing the shift register circuit of FIG. 3 in a frame of image time with an odd serial number according to some embodiments of the present disclosure. Referring to FIG. 4, in a frame of image time with an odd serial number, the first common control signal V1 is provided with a high voltage and the second common control signal V2 is provided with a low voltage. For example, V1=15V, V2=−7V. Optionally, now V2 is the same as the fixed low voltage VGL. During this time period, the second pull-down node PD2 is always kept at a low potential level and is not used by the Unit_n and Unit_n+1. For example, the low potential level of PD2 is −10V. The first pull-down node PD1 will be in use during a corresponding pull-down phase (or in the stabilizing period of the frame of image time with an odd serial number).

Figure 5:
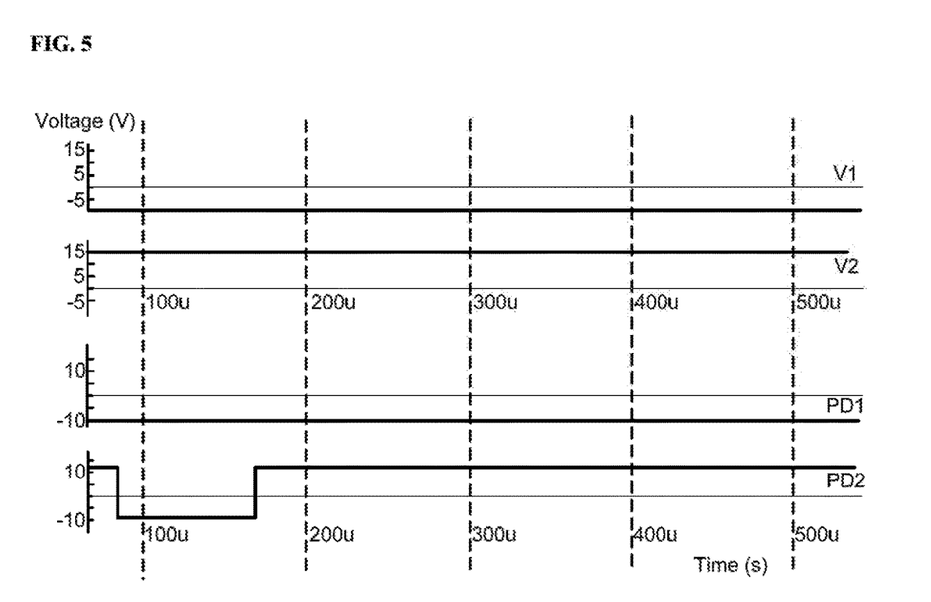
FIG. 5 is a waveform diagram of signals used for stabilizing the shift register circuit of FIG. 3 in a frame of image time with an even serial number according to some embodiments of the present disclosure.

FIG. 5 is a waveform diagram of signals used for stabilizing the shift register circuit of FIG. 3 in a frame of image time with an even serial number according to some embodiments of the present disclosure. Referring to FIG. 5, in a frame of image time with an even serial number, the first common control signal V1 is provided with a low voltage and the second common control signal V2 is provided with a high voltage. For example, V1=−7V, V2=15V. Optionally, now V1 is the same as the fixed low voltage VGL. During this time period, the first pull-down node PD1 is always kept at a low potential level and is not used by the Unit_n and Unit_n−1. For example, the low potential level of PD1 is −10V. The second pull-down node PD2 will be in use during a corresponding pull-down phase (or in the stabilizing period of the frame of image time with an even serial number).

Of course, the above setting can be reversed. In a frame of image time with an odd serial number, V1 is set low and V2 is set high. PD1 is not in use and PD2 is used in the stabilizing period. In a frame of image time with an even serial number, V1 is set high and V2 is set low. PD1 works and PD2 is not in use. Optionally, V1 and V2 can be alternately set to a high voltage through multiple frames of image time in each alternate cycle. Referring to both FIG. 4 and FIG. 5, each of the two common control signals V1 and V2 can have a 50% duty cycle at a high voltage in a period of one frame of image time T.

FIG. 6 is a timing waveform diagram of signals for driving the shift register circuit of FIG. 3 according to some embodiments of the present disclosure. Referring to FIG. 6, a method of alternately using PD1 and PD2 in odd or even numbered frame of image time to drive the shift register circuit of FIG. 3 is illustrated. Clock signals CLKA and CLKB are respectively provided for Unit_n and Unit_n+1. Each clock signal has a duty cycle ½ with a high voltage in a time period of 2t, where t is time for scanning one gate line of the display panel or time for displaying one line of image. The clock period is 4t.

Assuming that the clock signal CLK1 starts to provide a high voltage at a time point T1, the CLKA then starts with a high voltage at T1+t, delayed by t. The Clock signal CLKB then starts with a high voltage at T1+2t, CLK4 starts with a high voltage at T1+3t. The CLK1 and CLK4 are used by other shift register units nearby in the same cascaded series but not shown in FIG. 3. For example, CLK1 is used by the (n−1)-th unit adjacent to the n-th unit, CLK4 is used by the (n+2)-th unit adjacent to the (n+1)-th unit. In the embodiment, V1 has a high voltage start time being set at 0, and V2 has a high voltage start time being set at T, where T is one frame of image time. Correspondingly, the input signal=Output(n−2) has a high voltage pulse width of 2t, a period of one frame of image time T (i.e., the high voltage pulse appears only once within the frame of image time T), and a high voltage start time at T1−t. The reset signal=Output(n+3) also has a high voltage pulse width of 2t, a period of T, and high voltage start time at T1=4t. The clear-screen signal GCL has a period of T with a high voltage during the blank period between two frames of image time. VDD signal is always set to a high voltage DC signal. VSS is always set as a low voltage DC signal (or grounded to 0V or a negative voltage). The fixed low voltage VGL can be the same as VSS.

Referring to FIG. 6, the driving operation includes a precharge phase when an input signal is received a high voltage pulse, which turns on the precharge sub-circuit 23. The precharge sub-circuit applies VDD signal (high voltage) to the pull-up node PU to charge the node PU also to a high potential level. Further, the operation includes an output phase as the first clock signal CLKA provides a high voltage pulse. Through the function of the first output sub-circuit 24, the potential level of the pull-up node PU is pushed even higher. The first output sub-circuit 24 then outputs a high voltage signal to the first output terminal Output(n). At this time the second output terminals output a low voltage signal (or simply is kept at a low potential level). When the second clock signal CLKB is provided with a high voltage pulse delayed by t relative to the first clock signal CLKA, the second output sub-circuit 26 is able to output a high voltage signal to the second output terminal Output(n+1).

When the high voltage pulse of the first clock signal CLKA is dropped to low voltage, the first output terminal outputs a low voltage signal. At this time, the second output terminal continues outputting a high voltage signal until the high voltage pulse of the second clock signal is dropped to low voltage, then the second output terminal also outputs a low voltage signal.

The driving operation includes a pull-down phase. During the pull-down phase, the reset signal [Output(n+3)] is provided with a high voltage pulse which enables the reset sub-circuit to apply the VSS signal to the pull-up node PU to pull down its potential level to low. The first output sub-circuit 24 and the second output sub-circuit 26 then are turned off to keep potential levels at the first output terminal and the second output terminal at low.

For example as shown in FIG. 4 and FIG. 5, if the current frame of time is an odd numbered frame, the first common control signal V1 is set to a high voltage and the second common control signal V2 is set to a low voltage. In a beginning period of the frame of image time, the first pull-down node PD1 is also at a high potential level because of V1 is set to the high voltage and the second pull-down node PD is at a low potential level. When the pull-up node PU is precharged to a high potential level in the precharge phase and is pushed to an even higher potential level during the output phase, the precharge sub-circuit 23 will pull down the potential level of PD1 to low (as seen in FIG. 4 because of the transistors M2, M3, M4, and M5 are turned on as shown in FIG. 3). Then, as the reset signal is provided with a high voltage pulse (after the output signal from the second output terminal drops from high voltage to low voltage), the reset sub-circuit is able to pull down the potential level of the pull-up node PU to low to turn off the precharge sub-circuit 23. At this time, the potential level of the first pull-down node PD1 is raised again to high by the signal-control sub-circuit 21 with the first common control signal V1 still being a high voltage, while the potential level of the second pull-down node PD2 remains a low potential level with no effect to the first and the second shift register units. Only the high voltage of PD1 is effective during the stabilizing period started the same time as the pull-down phase and till the end of the frame of image time. During the stabilizing period, the first stabilizer unit uses the high potential level at the first pull-down node PD1 respectively through the first stabilizing sub-circuit, the third stabilizing sub-circuit, and the second stabilizing sub-circuit to maintain the pull-up node PU, the first output terminal, and the second output terminal stably at a fixed low voltage VGL.

If the current frame of image time is an even numbered frame, the above process is substantially similar, except only that PD1 is always at a low potential level without effect on the first and the second shift register units and PD2 will be effective during the stabilizing period started the same time as the pull-down phase and till the end of the frame of image time. During the stabilizing period, the second stabilizer unit uses the high potential level at the second pull-down node PD2 respectively through the fourth stabilizing sub-circuit, the fifth stabilizing sub-circuit, and the sixth stabilizing sub-circuit to maintain the pull-up node PU, the first output terminal, and the second output terminal stably at a fixed low voltage VGL.

Therefore, PD1 and PD2 are alternately used by the first stabilizer unit or the second stabilizer unit as the shift register circuit is used for scanning one frame of image after another. This method of alternately using the first and the second stabilizer unit also advantageously help to solve a problem of thin-film transistor threshold voltage drift issue within each of the stabilizer circuit. Therefore, the potential levels at the pull-up node and the gate line connected to each corresponding output terminal of the corresponding shift register unit will be substantially stable during each frame of image time.

Optionally, at an end of each frame of image time, a blank period may exist without any circuit outputs. At this time, the clear-screen signal GCL is provided with a high voltage signal, which can pull down all gate output signals (i.e., outputs from the first output terminal and the second output terminal of FIG. 3) to the low potential level of the fixed low voltage VGL.

In another aspect, the present disclosure provides a gate driver circuit including any embodiment of the shift register circuit described herein. Particularly, the gate driver circuit includes a number of cascaded shift register units wherein any two or more shift register units can share a stabilizer circuit for maintaining certain circuit nodes and outputs at stable potential levels especially during a time period when no high voltage signal is outputted. With, the function of sharing stabilizer circuit, the whole gate driver circuit becomes more stable without increasing number of transistors therein.

Figure 7:
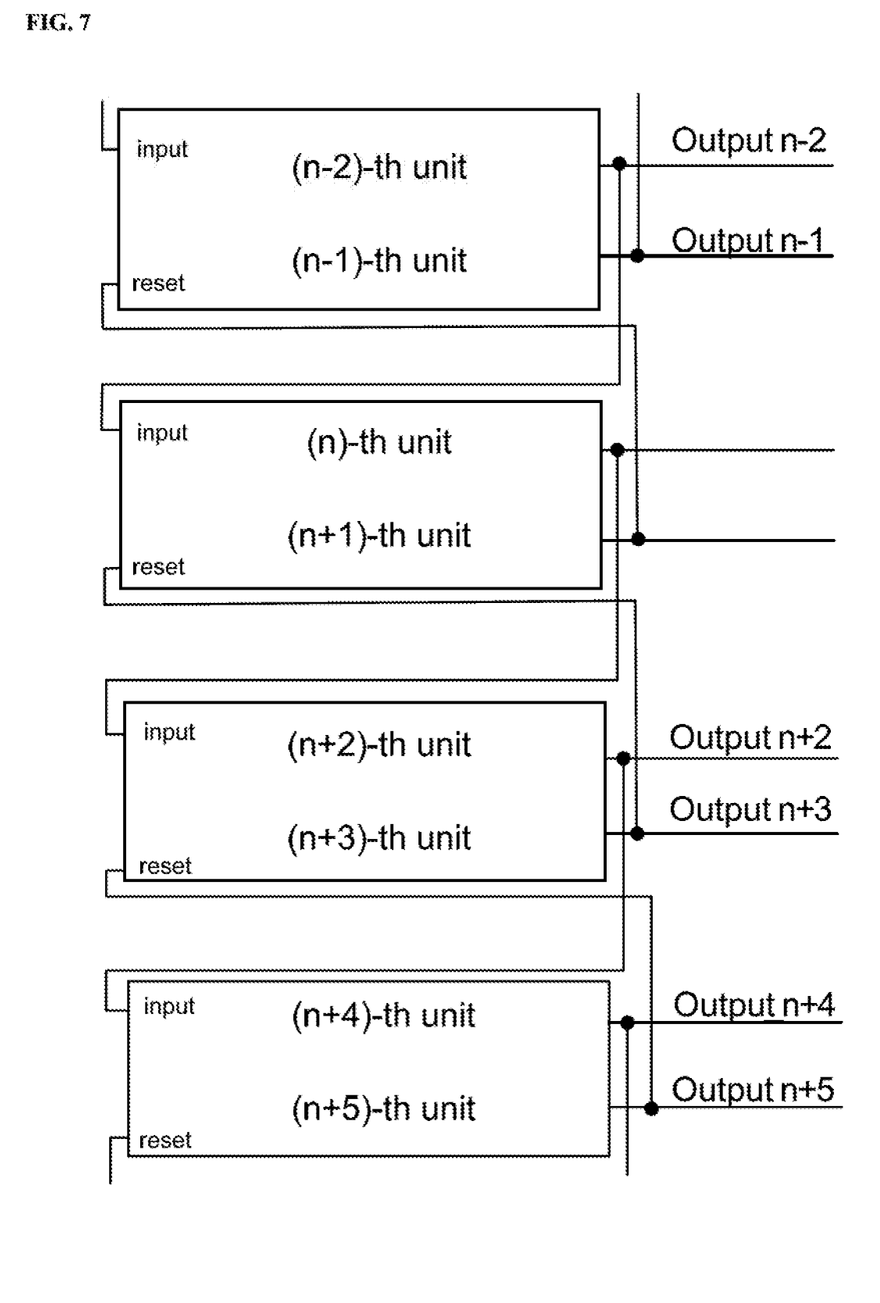
FIG. 7 is a simplified diagram of a gate driver circuit based on a shift register circuit of the present disclosure.

FIG. 7 is a simplified diagram of a gate driver circuit based on a shift register circuit of the present disclosure. Referring to FIG. 7, the gate driver circuit includes a number shift register units cascaded in multiple stages. A first stage shift register unit and a second stage shift register unit share a stabilizer circuit. The first stage shift register unit and the second stage shift register unit use an input signal provided from a frame start signal and a reset signal provided from an output signal of a 4-th stage shift register unit. The 3rd stage shift register unit and the 4-th stage shift register unit share a stabilizer circuit. The 3rd stage shift register unit and the 4-th stage shift register unit receives an input signal provided from the output signal of the first stage shift register unit and a reset signal provided from the output signal of the 6-th stage shift register unit, and so on. The n-th shift register unit and the (n+1)-th stage shift register unit share a stabilizer circuit. The n-th stage shift register unit and the (n+1)-th stage shift register unit receives an input signal provided from an output signal of the (n−2)-th stage shift register unit and a reset signal provided from an output signal of the (n+3)-th stage shift register unit, where n is an integer greater than 3. The last stage shift register unit receives a reset signal provided by a first control signal.

Optionally, the first control signal can be generated by a timing control circuit. Optionally, a first circuit is set up in the gate driver circuit to couple with the timing control circuit. The first circuit is configured to generate the first control signal based on an output signal of the timing control circuit.

Optionally, each stage shift register unit receives a clock signal that is delayed by ¼ of a clock period relative to the clock signal provided to the previous adjacent stage shift register unit. Optionally, the gate driver circuit is used as a Gate Driver on Array (GOA) circuit for driving a display panel for displaying a frame of image by scanning one gate line after another. This GOA circuit is advantageous in circuit stability with less number of transistors that is suitable for narrow-border small sized display products such as smart phone.

In another aspect, the present disclosure provides a display apparatus includes any one of shift register circuit described herein or includes a GOA circuit described herein. The display apparatus is provided with simplified GOA driving circuit structure, improved function on stability control and threshold voltage drift control, reduced costs, and enhanced display quality. The display apparatus is applicable to but not limited to liquid crystal display panel, electronic paper, OLED display panel, smart phone, tablet computer, television set, displayer, notebook computer, digital frame, navigator, and any product or component having display function.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift register circuit comprising:
   a plurality of shift register units cascaded in series including a first shift register unit and a second shift register unit, the first shift register unit comprising a first pull-up node, a first pull-down node, and a first output terminal, and the second shift register unit comprising a second pull-up node, a second pull-down node, and a second output terminal; and a stabilizer circuit coupled to both the first shift register unit and the second shift register unit, wherein the first pull-up node is directly connected to the second pull-up node as a common pull-up node and the stabilizer circuit is configured to maintain a potential level of the common pull-up node stable during a stabilizing period when none of the first output terminal and the second output terminal output a turn-on signal;

wherein the stabilizer circuit comprises a first stabilizer unit and a second stabilizer unit;

the first stabilizer unit is coupled to the first shift register unit;

the second stabilizer unit is coupled to the second shift register unit; and each of the first stabilizer unit and the second stabilizer unit is shared in use alternately in time by both the first shift register unit and the second shift register unit to maintain a potential level of the common pull-up node stable while no turn-on signal is outputted at either the first output terminal or the second output terminal;

wherein the first stabilizer unit comprises:

a first stabilizing sub-circuit directly connected to a fixed low voltage terminal and configured to receive a fixed low voltage to pull down the potential level of the common pull-up node to the fixed low voltage when the potential level of the first pull-down node is high;

a second stabilizing sub-circuit configured to receive the fixed low voltage and pull down the potential level of the second output terminal to the fixed low voltage when the potential level of the first pull-down node is high; and a third stabilizing sub-circuit configured to receive the fixed low voltage and pull down the potential level of the first output terminal to the fixed low voltage when the potential level of the first pull-down node is high;

wherein the second stabilizer unit comprises:

a fourth stabilizing sub-circuit directly connected to a fixed low voltage terminal and configured to receive a fixed low voltage to pull down a potential level of the common pull-up node to the fixed low voltage when the potential level of the second pull-down node is high;

a fifth stabilizing sub-circuit configured to receive the fixed low voltage and to pull down a potential level of the first output terminal to the fixed low voltage when the potential level of the second pull-down node is high;

a sixth stabilizing sub-circuit configured to receive the fixed low voltage and to pull down a potential level of the second output terminal to the fixed low voltage when the potential level of the second pull-down node is high;

wherein the first shift register unit is a n-th unit of the plurality of shift register units and the second shift register unit is a (n+1)-th unit of the plurality of shift register units;

wherein the first shift register unit comprises a precharge sub-circuit connected to the first stabilizing sub-circuit, a high-voltage VDD power source, and the common pull-up node, and configured to receive an output signal of a (n−2)-th unit of the plurality of shift register units, n is an integer greater than 2;

wherein the second shift register unit comprises a reset sub-circuit connected to the second stabilizing sub-circuit, a low-voltage VSS power source, and the common pull-up node, and configured to receive an output signal of a (n+3)-th unit of the plurality of shift register units.

2. The shift register circuit of claim 1, wherein the first pull-down node is a shared pull-down node for both the first shift register unit and the second shift register unit in the stabilizing period within a frame of image time with an odd serial number and the second pull-down node is the shared pull-down node for both the first shift register unit and the second shift register unit in the stabilizing period within a frame of image time with an even serial number.

3. The shift register circuit of claim 2, wherein the first stabilizer unit comprises:

a first signal-control sub-circuit configured to receive a first common control signal and set a potential level of the first pull-down node to that of the first common control signal.

4. The shift register circuit of claim 3, wherein the first shift register unit further comprises:

a first output sub-circuit coupled to the common pull-up node, wherein the precharge sub-circuit is coupled to the common pull-up node and is configured to receive the output signal of the (n−2)-th unit and the high-voltage VDD signal, to pull up the potential level of the common pull-up node to high voltage, and to pull down the potential level of the first pull-down node to that of the low-voltage signal when the potential level of the common pull-up node becomes high, wherein the first output sub-circuit includes a capacitor and a transistor configured to receive a first clock signal and controlled by the potential level of the common pull-up node and the first clock signal to output a high-voltage signal to the first output terminal;

the second shift register unit further comprises:

a second output sub-circuit respectively coupled to the common pull-up node, wherein reset sub-circuit is coupled to the common pull-up node and includes a transistor configured to receive the output signal of the (n+3)-th unit and the low-voltage VSS signal; and to pull down the potential level of the common pull-up node to low, wherein the second output sub-circuit includes a capacitor and a transistor configured to receive a second clock signal and controlled by the potential level of the common pull-up node and the second clock signal to output a high-voltage signal to the second output terminal.

5. The shift register circuit of claim 4, wherein the precharge sub-circuit comprises:

a first transistor having a gate receiving the output signal of the (n−2)-th unit, a first terminal receiving the high-voltage VDD signal, and a second terminal coupled to the common pull-up node;

a second transistor having a gate coupled to the common pull-up node, a first terminal coupled to the first pull-down node, and a second terminal receiving the low-voltage signal, and a third transistor having a gate coupled to the common pull-up node, a first terminal coupled to the first signal-control sub-circuit of the first stabilizer circuit, and a second terminal receiving the low-voltage signal;

the first signal-control sub-circuit comprises:

a fourth transistor having a gate receiving the first common control signal, a first terminal coupled to the gate, and a second terminal coupled to the first terminal of the third transistor;

a fifth transistor having a gate coupled to the second terminal of the fourth transistor, a first terminal coupled to the first terminal of fourth transistor, and a second terminal coupled to the first pull-down node;

the first stabilizing sub-circuit comprises a sixth transistor having a gate coupled to the first pull-down node, a first terminal coupled to the common pull-up node, and a second terminal receiving the low-voltage signal;

the second stabilizing sub-circuit comprises a seventh transistor having a gate coupled to the first pull-down node, a first terminal coupled receiving the low-voltage signal, and a second terminal coupled to the second output terminal; and the third stabilizing sub-circuit comprises an eighth transistor having a gate coupled to the first pull-down node, a first terminal receiving the low-voltage signal, and a second terminal coupled to the first output terminal.

6. The shift register circuit of claim 4, wherein the first clock signal comprises a waveform characterized by a high-voltage signal with 50% duty cycle in a first period of 4t, where t is a line of image time corresponding to displaying one line of image; the second clock signal comprises a waveform characterized by a high-voltage pulse signal with 50% duty cycle in a second period of 4t and provided with a time delay oft relative to the first clock signal; the common control signal comprises a high voltage during one frame of image time with an odd serial number to make the potential level of the shared pull-down node of the first shift register unit at high shared with the second shift register unit to maintain potential levels of the common pull-up node, the first output terminal, and the second output terminal at low in the stabilizing period within the one frame of image time with the odd serial number, and the common control signal comprises a high voltage during one frame of image time with an even serial number to make the potential level of the shared pull-down node of the second shift register unit at high shared with the first shift register unit to maintain potential levels of the common pull-up node, the first output terminal, and the second output terminal at low in the stabilizing period within the one frame of image time with the even serial number.

7. The shift register circuit of claim 1, wherein the first stabilizer unit is in use in one frame of image time with an odd serial number and the second stabilizer unit is in use in one frame of image time with an even serial number.

8. The shift register circuit of claim 7, wherein the first pull-down node coupled to the first stabilizer unit and the second pull-down node coupled to the second stabilizer unit, the first pull-down node being used by the first stabilizer unit for controlling both the first shift register unit and the second shift register unit in a stabilizing period of the one frame of image time with the odd serial number, and the second pull-down node being used by the second stabilizer unit for controlling both the first shift register unit and the second shift register unit in a stabilizing period of the one frame of image time with the even serial number.

9. The shift register circuit of claim 8, wherein the first stabilizer unit comprises a first signal-control sub-circuit configured to receive a first common control signal and set a potential level of the first pull-down node to that of the first common control signal, the second stabilizer unit comprises a second signal-control sub-circuit configured to receive a second common control signal and set a potential level of the second pull-down node to that of the second common control signal; wherein the first common control signal is provided with a high voltage while the second common control signal is provided with a low voltage in one frame of image time with the odd serial number, the first common control signal is provided with a low voltage while the second common control signal is provided with a high voltage in one frame of image time with the even serial number.

10. The shift register circuit of claim 9, wherein
the first signal-control sub-circuit comprises:
a fourth transistor having a gate and a first terminal commonly supplied with the first common control signal;
a fifth transistor having a gate coupled to a second terminal of a fourth transistor, a first terminal coupled to the first terminal of the fourth transistor, and a second terminal coupled to the first pull-down node;
the second signal-control sub-circuit comprises:
a thirteenth transistor having a gate and a first terminal commonly supplied with the second common control signal;
a fourteenth transistor having a gate coupled to a second terminal of the thirteenth transistor, a first terminal coupled to the first terminal of the thirteenth transistor, and a second terminal coupled to the second pull-down node.

11. The shift register circuit of claim 1, wherein
the first stabilizing sub-circuit comprises a fifth transistor having a gate coupled to the first pull-down node, a first terminal coupled to the common pull-up node, and a second terminal directly connected to the fixed low voltage terminal and configured to receive the fixed low voltage;
the second stabilizing sub-circuit comprises a sixth transistor having a gate coupled to the first pull-down node, a first terminal coupled to the second output terminal, and a second terminal received the fixed low voltage;
the third stabilizing sub-circuit comprises a seventh transistor having a gate coupled to the first pull-down node, a first terminal coupled to the first output terminal, and a second terminal received the fixed low voltage;
the fourth stabilizing sub-circuit comprises an eighth transistor having a gate coupled to the second pull-down node, a first terminal coupled to the common pull-up node, and a second terminal directly connected to the fixed low voltage terminal and configured to receive the fixed low voltage;
the fifth stabilizing sub-circuit comprises a ninth transistor having a gate coupled to the second pull-down node, a first terminal coupled to the first output terminal, and a second terminal received the fixed low voltage;
the sixth stabilizing sub-circuit comprises a tenth transistor having a gate coupled to the second pull-down node, a first terminal coupled to the second output terminal, and a second terminal received the fixed low voltage.

12. The shift register circuit of claim 7, wherein the first shift register unit comprises a clear-screen sub-circuit configured to receive a clear-screen signal for controlling potential levels of the first output terminal and the second output terminal at low during any time span between a frame of image time with an odd serial number and a previous or next frame of image time with an even serial number; wherein the clear-screen sub-circuit comprises an eleventh transistor having a gate configured to receive the clear-screen signal, a first terminal coupled to the first output terminal, and a second terminal received a fixed low voltage; and a twelfth transistor having a gate configured to receive the clear-screen signal, a first terminal coupled to the second output terminal, and a second terminal received the fixed low voltage.

13. The shift register circuit of claim 9, wherein the first common control signal is provided with a low voltage while the second common control signal is provided with a high voltage in one frame of image time with the odd serial number, the first common control signal is provided with a high voltage while the second common control signal is provided with a low voltage in one frame of image time with the even serial number.

14. The shift register circuit of claim 8, wherein the first shift register unit is a n-th unit of the plurality of shift register units and the second shift register unit is a (n+1)-th unit of the plurality of shift register units, wherein the n-th unit receives an input signal which is an output signal of a (n−2)-th unit of the plurality of shift register units and a reset signal which is an output signal of a (n+3)-th unit of the plurality of shift register units, wherein n is an integer greater than 2, wherein the n-th unit is configured to receive a first clock signal and the (n+1)-th unit is configured to receive a second clock signal, wherein the first clock signal and the second clock signal have a same clock period, the second clock signal has a time delay relative to the first clock signal, the time delay being set to be a quarter of the clock period.

15. A display apparatus comprising the shift register circuit of claim 1, and a display panel connected to the shift register circuit.

16. A method for driving the shift register circuit of claim 9, the method comprising:
  providing a high voltage to the first common control signal and a low voltage to the second common control signal in a frame of image time with an odd serial number;
  providing a first clock signal with a clock period;
  providing a second clock signal with the same clock period and a time-delay of ¼ of the clock period relative to the first clock signal;
  receiving the output signal of the (n−2)-th unit with a pulse width of ½ of the clock period and a phase ahead of that of the first clock signal by ½ of the clock period;
  outputting a turn-on signal at the first output terminal with a pulse width of ½ of the clock period and a phase delayed by ½ of the clock period relative to the input signal;
  outputting a turn-on signal at the second output terminal with a pulse width of ½ of the clock period and a phase delayed by ¼ of a clock signal relative to the turn-on signal at the first output terminal;
  receiving the output signal of the (n+3)-th unit with a pulse width of ½ of the clock period and a phase delayed by ½ of the clock period relative to the turn-on signal at the second output terminal;
  pulling up the first pull-down node to the high voltage of the first common control signal in a stabilizing period started as the output signal of the (n+3)-th unit is provided and lasted to an end of the frame of image time;
  maintaining the common pull-up node, the first output terminal, and the second output terminal at a fixed low voltage during the stabilizing period.

17. The method of claim 16, further comprising:
  providing a low voltage to the first common control signal and a high voltage to the second common control signal in a frame of image time with an even serial number;
  pulling up the second pull-down node to the high voltage of the second common control signal in a stabilizing period started as the output signal of the (n+3)-th unit provided and lasted to an end of the frame of image time;
  maintaining the common pull-up node, the first output terminal, and the second output terminal at the fixed low voltage during the stabilizing period;
  wherein the frame of image time with an odd serial number and the frame of image time with an even serial number are alternate in time.

18. The method of claim 17, wherein the frame of image time with an odd serial number and the frame of image time with an even serial number are alternate in time.

19. The shift register circuit of claim 1, wherein the precharge sub-circuit comprises a precharge transistor having a gate receiving the output signal of the (n−2)-th unit of the plurality of shift register units, a first terminal connected to the high-voltage VDD signal, and a second terminal connected to the common pull-up node and the first stabilizing sub-circuit; and
  the reset sub-circuit comprises a reset transistor having a gate receiving the output signal of the (n+3)-th unit of the plurality of shift register units, a first terminal connected to the low-voltage VSS power source, and a second terminal connected to the common pull-up node and the fourth stabilizing sub-circuit.

20. The shift register circuit of claim 10, wherein the first stabilizing sub-circuit comprises a transistor having a gate connected to the first pull-down node, a first terminal connected to the common pull-up node and the second terminal of the precharge transistor, and a second terminal directly connected to the fixed low voltage terminal and configured to receive the fixed low voltage; and
  the fourth stabilizing sub-circuit comprises a transistor having a gate connected to the second pull-down node, a first terminal connected to the common pull-up node and the second terminal of the reset transistor, and a second terminal directly connected to the fixed low voltage terminal and configured to receive the fixed low voltage.

* * * * *